United States Patent
Nishimura

(10) Patent No.: US 9,698,092 B2
(45) Date of Patent: Jul. 4, 2017

(54) ELECTRONIC DEVICE

(71) Applicant: ROHM CO., LTD., Kyoto-shi, Kyoto (JP)

(72) Inventor: Isamu Nishimura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/757,968

(22) Filed: Dec. 24, 2015

(65) Prior Publication Data

US 2016/0190051 A1 Jun. 30, 2016

(30) Foreign Application Priority Data

Dec. 26, 2014 (JP) ................................ 2014-264393

(51) Int. Cl.
| | |
|---|---|
| H01L 23/31 | (2006.01) |
| H01L 23/498 | (2006.01) |
| H01L 23/13 | (2006.01) |
| H01L 23/14 | (2006.01) |
| H01L 21/48 | (2006.01) |
| H05K 1/16 | (2006.01) |

(52) U.S. Cl.
CPC ...... *H01L 23/49827* (2013.01); *H01L 21/486* (2013.01); *H01L 23/13* (2013.01); *H01L 23/147* (2013.01); *H01L 23/3107* (2013.01); *H01L 23/49811* (2013.01); *H01L 2224/16225* (2013.01); *H01L 2924/0002* (2013.01); *H01L 2924/181* (2013.01); *H05K 1/162* (2013.01); *H05K 1/167* (2013.01)

(58) Field of Classification Search
CPC ........... H01L 23/49827; H01L 23/3107; H01L 23/49894; H01L 23/49811; H01L 23/49838; H01L 2924/14; H01L 2224/05571; H01L 2224/05572; H01L 23/481; H01L 23/5384; H05K 1/162; H05K 1/167; H05K 2201/09827; H05K 2201/09645; H05K 3/403
USPC .................................................. 257/774, 778
See application file for complete search history.

(56) References Cited

U.S. PATENT DOCUMENTS 6,091,027 A * 7/2000 Hesselbom ........... H01L 21/486
174/255
8,415,811 B2 4/2013 Fukumura et al.

FOREIGN PATENT DOCUMENTS

JP 2012099673 5/2012

* cited by examiner

*Primary Examiner* — Caleen Sullivan
(74) *Attorney, Agent, or Firm* — Hamre, Schumann, Mueller & Larson, P.C.

(57) ABSTRACT

An electronic device, suitable for achieving a smaller size, includes a semiconductor substrate having a main surface and a back surface opposite to the main surface, a main electronic element arranged on the substrate, and a conducting layer electrically connected to the main electronic element. The substrate is formed with an element arrangement recessed portion that is recessed from the main surface and in which the main electronic element is arranged. The element arrangement recessed portion has a bottom surface facing in the thickness direction, and a side surface inclined with respect to the thickness direction of the substrate. The electronic device includes an auxiliary electronic element formed on the side surface of the element arrangement recessed portion.

25 Claims, 10 Drawing Sheets

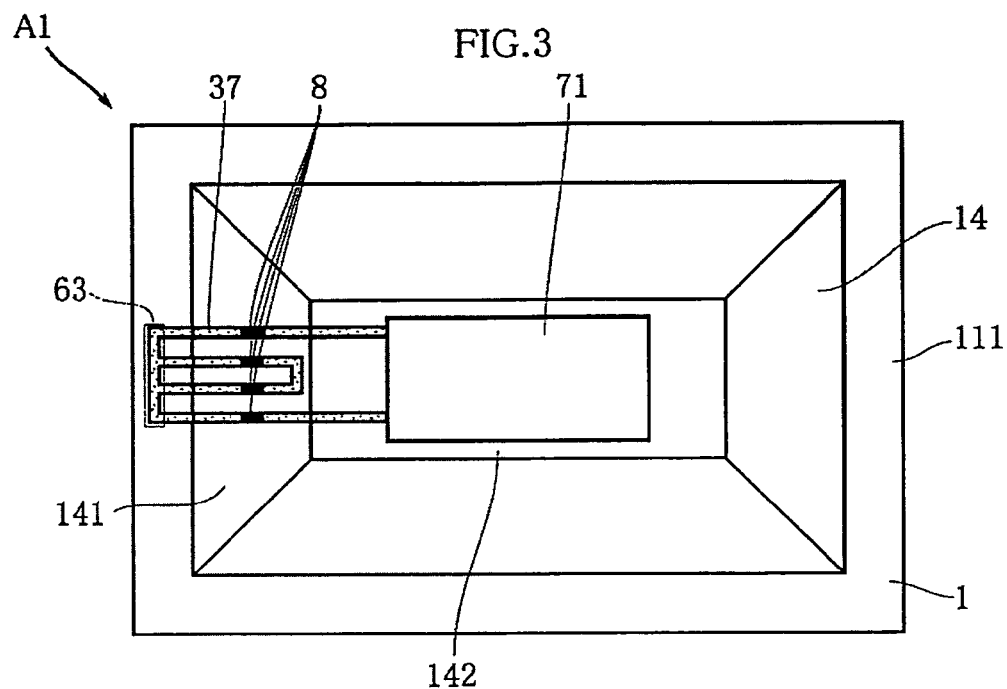
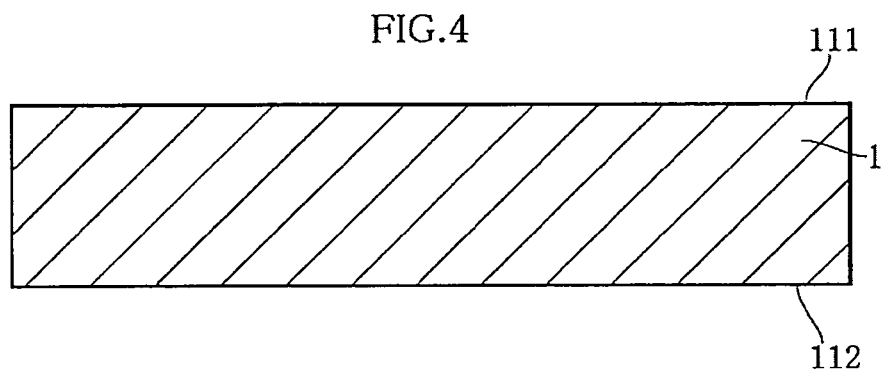
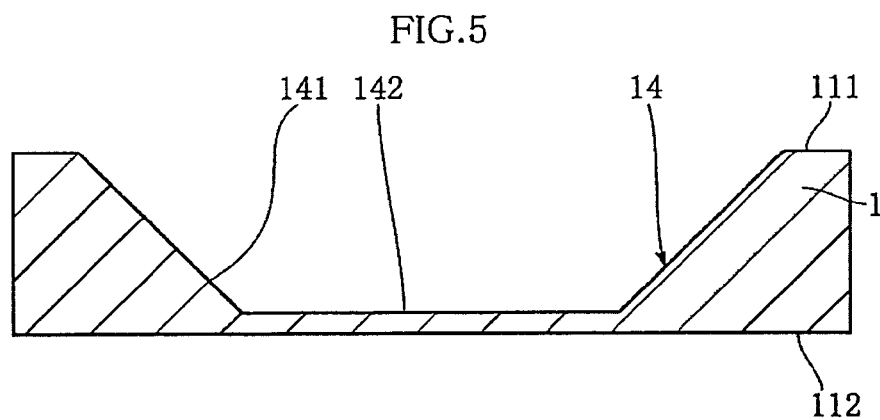

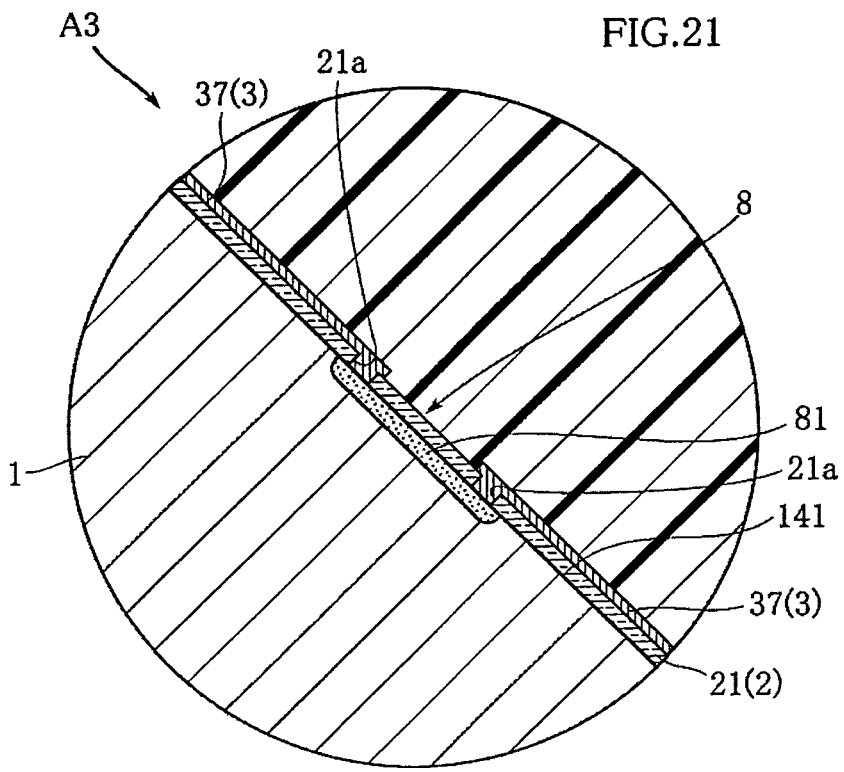
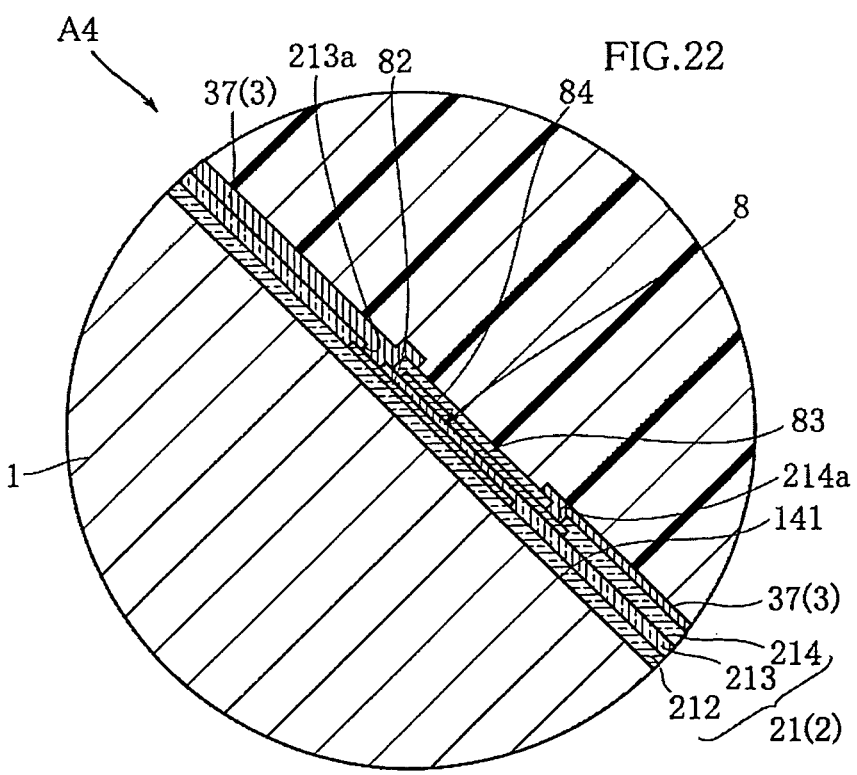

ELECTRONIC DEVICE

BACKGROUND OF THE INVENTION

1. Field of the Invention

The present invention relates to an electronic device.

2. Description of Related Art

Various types of electronic devices for carrying out specific functions in response to input/output of current from an external source have been proposed. In general, in order to carry out the function of an electronic device, multiple electronic elements that each constitute part of an electrical circuit are included. Metal leads are used in order to support these electronic elements and electrically connect them to each other. The number, shape, and size of the leads are determined in accordance with the function, shape, and size of the multiple elements. The multiple electronic elements mounted on the leads are covered with sealing resin. Sealing resin is for protecting the electronic elements and a portion of the leads. Such an electronic device is used while mounted on a circuit board or the like of an electronic apparatus, for example. Accompanying the advancement of technology, demand for smaller sizes of electronic devices is increasing. JP 2012-99673A is given as literature relating to electronic devices.

SUMMARY OF THE INVENTION

The present invention is conceived of in the above-described situation, and aims to provide an electronic device that is suitable for achieving a smaller size.

The electronic device provided by an embodiment of the present invention includes: a substrate that has a main surface and a back surface facing mutually opposite sides in a thickness direction and is formed of a semiconductor material; a main electronic element; an auxiliary electronic element; and a conducting layer electrically connected to the main electronic element. An element arrangement recessed portion, which is recessed from the main surface and in which the main electronic element is arranged, is formed in the substrate. The element arrangement recessed portion has an element arrangement recessed portion bottom surface facing in the thickness direction, and an element arrangement recessed portion side surface inclined with respect to the thickness direction of the substrate. The auxiliary electronic element is formed on the element arrangement recessed portion side surface.

In an embodiment, the electronic device includes an insulating layer including a recessed portion inner surface insulating portion covering at least the element arrangement recessed portion side surface of the element arrangement recessed portion.

In an embodiment, the auxiliary electronic element is a resistor.

In an embodiment, the auxiliary electronic element has a resistive layer formed on the recessed portion inner surface insulating portion.

In an embodiment, the recessed portion inner surface insulating portion includes a first insulating layer disposed on the element arrangement recessed portion side surface, and a second insulating layer located away from the element arrangement recessed portion side surface, and the auxiliary electronic element is provided between the first insulating layer and the second insulating layer.

In an embodiment, the second insulating layer has an insulating layer through-hole through which the resistive layer and the conducting layer are connected.

In an embodiment, the auxiliary electronic element has a resistive layer formed by modifying a portion of the element arrangement recessed portion side surface.

In an embodiment, the recessed portion inner surface insulating portion covers the resistive layer.

In an embodiment, the recessed portion inner surface insulating portion has an insulating layer through-hole through which the resistive layer and the conducting layer are connected.

In an embodiment, the auxiliary electronic element is a capacitor.

In an embodiment, the auxiliary electronic element includes a first electrode layer disposed on the element arrangement recessed portion side surface, a second electrode layer located away from the element arrangement recessed portion side surface, and a dielectric layer interposed between the first electrode layer and the second electrode layer.

In an embodiment, a through-hole penetrating from the element arrangement recessed portion to the back surface is formed, the through-hole has a through-hole inner surface, and the conducting layer is formed so as to span from the element arrangement recessed portion to the back surface via the through-hole inner surface.

In an embodiment, the main electronic element is arranged on the element arrangement recessed portion bottom surface.

In an embodiment, the element arrangement recessed portion bottom surface is a surface that is orthogonal to the thickness direction.

In an embodiment, the insulating layer comprises $SiO_2$ or SiN.

In an embodiment, the insulating layer includes a through-hole inner surface insulating portion formed on an inner surface of the through-hole.

In an embodiment, a cross-sectional dimension of the through-hole increases toward the back surface starting from the main surface.

In an embodiment, the recessed portion inner surface insulating portion has an auxiliary through-hole that coincides with an edge of the through-hole disposed adjacent to the main surface in a view in the thickness direction.

In an embodiment, a cross-sectional shape of the auxiliary through-hole is constant in the thickness direction.

In an embodiment, the insulating layer includes an auxiliary through-hole inner surface insulating portion that is formed on an inner surface of the auxiliary through-hole and connects to the through-hole inner surface insulating portion.

In an embodiment, the conducting layer includes an auxiliary through-hole blocking portion that blocks the auxiliary through-hole in the element arrangement recessed portion.

In an embodiment, the conducting layer includes a through-hole inner surface conducting portion that is in contact with the auxiliary through-hole blocking portion, at least a portion of the through-hole inner surface conducting portion being formed on the through-hole inner surface insulating portion.

In an embodiment, the insulating layer includes a back surface side insulating portion, and at least a portion of the back surface side insulating portion is formed on the back surface of the substrate.

In an embodiment, the electronic device further includes a back surface insulating film, at least a portion thereof being formed on the back surface. The back surface side insulating film has a portion formed in the through-hole, and the conducting layer is interposed between the back surface side insulating film and the substrate.

In an embodiment, the electronic device further includes a back surface electrode pad formed on the back surface. The back surface electrode pad is in contact with the conducting layer and is electrically connected to the main electronic element.

In an embodiment, the conducting layer includes a seed layer and a plating layer and the seed layer is interposed between the substrate and the plating layer.

In an embodiment, the electronic device further includes a sealing resin portion that fills the element arrangement recessed portion and covers the main electronic element.

In an embodiment, the substrate is formed of a single-crystal semiconductor material.

In an embodiment, the semiconductor material is Si.

In an embodiment, the main surface and the back surface are orthogonal to the thickness direction of the substrate and are flat.

In an embodiment, the main surface is a (100) surface.

According to the present invention, the auxiliary electronic elements are formed on the element arrangement recessed portion side surface. Unlike the mode of being mounted using solder or the like, the main components of the auxiliary electronic elements are formed directly or indirectly on the element arrangement recessed portion side surface. As a result, it is possible to significantly increase the arrangement accuracy of the auxiliary electronic elements compared to the conventional case of mounting separately-formed auxiliary electronic elements on the element arrangement recessed portion side surface, which contributes to the size reduction and high-density arrangement of the auxiliary electronic elements. Accordingly, the electronic device can be made smaller.

Other features and advantages of the present invention will become apparent from the detailed description given below with reference to the accompanying drawings.

BRIEF DESCRIPTION OF THE DRAWINGS

FIG. 3 is a plan view showing relevant parts of a substrate of the electronic device shown in FIG. 1.

FIG. 4 is a cross-sectional view showing an example of a method for manufacturing the electronic device shown in FIG. 1.

FIG. 5 is a cross-sectional view showing an example of a method for manufacturing the electronic device shown in FIG. 1.

FIG. 21 is an enlarged cross-sectional view showing a relevant part of the electronic device based on the third embodiment of the present invention.

FIG. 22 is an enlarged cross-sectional view showing a relevant part of an electronic device based on a fourth embodiment of the present invention.

DESCRIPTION OF THE PREFERRED EMBODIMENTS

Preferred embodiments of the present invention will be described in detail with reference to the drawings.

Figure 1:
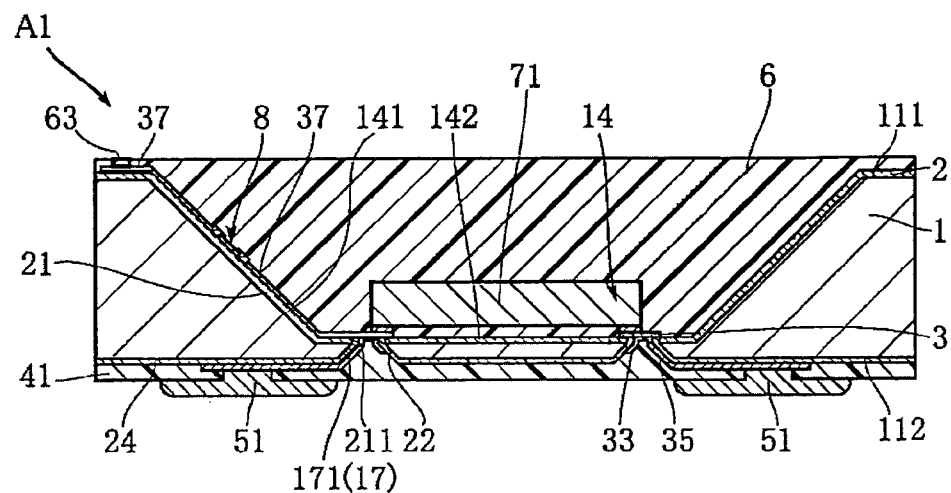
FIG. 1 is a cross-sectional view showing an electronic device based on a first embodiment of the present invention.
Figure 2:
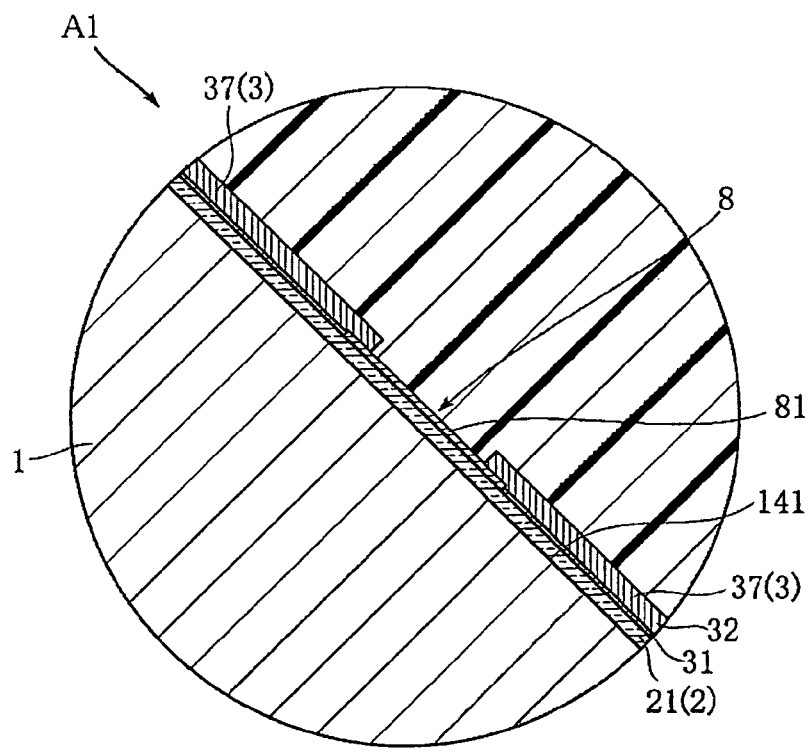
FIG. 2 is an enlarged cross-sectional view showing a relevant part of the electronic device shown in FIG. 1.

FIGS. 1 to 3 show an electronic device based on a first embodiment of the present invention. An electronic device A1 of the present embodiment includes a substrate 1, an insulating layer 2, a conducting layer 3, a back surface side insulating film 41, back surface electrode pads 51, a sealing resin portion 6, a main electronic element 71, and multiple auxiliary electronic elements 8. FIG. 1 is a cross-section taken in the thickness direction of the electronic device A1. FIG. 2 is an enlarged cross-sectional view showing a relevant portion of the electronic device A1. Also, FIG. 3 is a plan view showing relevant portions with the sealing resin portion 6 omitted.

The substrate 1 is formed of a single-crystal semiconductor material. The substrate 1 is formed of single-crystal Si in the present embodiment. The material of the substrate 1 is not limited to being Si, and may be SiC, for example. The thickness of the substrate 1 is 200 to 550 μm, for example. The main electronic element 71 and the auxiliary electronic elements 8 are arranged on the substrate 1.

The substrate 1 has a main surface 111 and a back surface 112.

The main surface 111 faces one side in the thickness direction. The main surface 111 is flat. The main surface 111 is orthogonal to the thickness direction. The main surface 111 is a (100) surface or a (110) surface. In the present embodiment, the main surface 111 is a (100) surface.

The back surface 112 faces the other side in the thickness direction. That is, the back surface 112 and the main surface 111 face mutually opposite sides. The back surface 112 is flat. The back surface 112 is orthogonal to the thickness direction.

An element arrangement recessed portion 14 and two through-holes 17 are formed in the substrate 1.

The element arrangement recessed portion 14 is recessed from the main surface 111. The main electronic element 71 and the multiple auxiliary electronic elements 8 are arranged in the element arrangement recessed portion 14. The depth of the element arrangement recessed portion 14 (distance between the main surface 111 and a later-described element arrangement recessed portion bottom surface 142 in the thickness direction) is 100 to 300 µm, for example. The element arrangement recessed portion 14 is rectangular in a view in the thickness direction. The shape of the element arrangement recessed portion 14 depends on the fact that a (100) surface is used as the main surface 111.

The element arrangement recessed portion 14 has element arrangement recessed portion side surfaces 141 and an element arrangement recessed portion bottom surface 142.

The element arrangement recessed portion bottom surface 142 faces the same side as the main surface 111 in the thickness direction of the substrate 1. The element arrangement recessed portion bottom surface 142 is rectangular in a view in the thickness direction. The main electronic element 71 is arranged on the element arrangement recessed portion bottom surface 142. The element arrangement recessed portion bottom surface 142 is a surface that is orthogonal to the thickness direction.

The element arrangement recessed portion side surfaces 141 rise from the element arrangement recessed portion bottom surface 142. The element arrangement recessed portion side surfaces 141 are connected to the element arrangement recessed portion bottom surface 142 and the main surface 111. The element arrangement recessed portion side surfaces 141 are inclined with respect to the thickness direction. The angle of the element arrangement recessed portion side surfaces 141 with respect to a plane orthogonal to the thickness direction is 55 degrees. This is due to the fact that a (100) surface is used as the main surface 111. The element arrangement recessed portion side surfaces 141 are four flat surfaces.

The through-holes 17 each penetrate a portion of the substrate 1 from the element arrangement recessed portion bottom surface 142 to the back surface 112. In the present embodiment, there are multiple (two) through-holes 17. The depth of the through-holes 17 is 10 to 50 µm, for example. The dimension of the largest opening of the through-holes 17 in a view in the thickness direction of the substrate 1 is 10 to 50 µm, for example. The ratio of the depth of the through-holes 17 to the dimension of the largest opening of the through-holes 17 in a view in the thickness direction of the substrate 1 is 0.2 to 5. In the present embodiment, the through-holes 17 are rectangular in a view in the thickness direction. Also, in the present embodiment, the cross-sectional dimensions of the through-holes 17 increase toward the back surface 112 starting from the main surface 111 in the thickness direction.

The through-holes 17 each have through-hole inner surfaces 171.

The through-hole inner surfaces 171 are inclined with respect to the thickness direction of the substrate 1. The through-hole inner surfaces 171 are four flat surfaces. In the present embodiment, the through-hole inner surfaces 171 are connected to the element arrangement recessed portion bottom surface 142 and the back surface 112. The angle of the through-hole inner surfaces 171 with respect to a plane orthogonal to the thickness direction is 55 degrees. This is due to the fact that a (100) surface is used as the main surface 111.

The insulating layer 2 is interposed between the conducting layer 3 and the substrate 1. The thickness of the insulating layer 2 is about 0.1 to 1.0 µm, for example. The insulating layer 2 is formed of $SiO_2$ or SiN, for example.

The insulating layer 2 has a recessed portion inner surface insulating portion 21, through-hole inner surface insulating portions 22, auxiliary through-hole inner surface insulating portions 23, and a back surface side insulating portion 24.

The recessed portion inner surface insulating portion 21 is formed in the element arrangement recessed portion 14 of the substrate 1. In the present embodiment, the recessed portion inner surface insulating portion 21 is formed on all of the element arrangement recessed portion side surfaces 141 and the element arrangement recessed portion bottom surface 142. The recessed portion inner surface insulating portion 21 is formed through thermal oxidation, for example. The recessed portion inner surface insulating portion 21 is formed of $SiO_2$, for example.

Auxiliary through-holes 211 are formed in the recessed portion inner surface insulating portion 21. The auxiliary through-holes 211 penetrate the recessed portion inner surface insulating portion 21 in the thickness direction. Also, the auxiliary through-holes 211 are located in the through-holes 17 in a view in the thickness direction. The cross-sectional shape of the auxiliary through-holes 211 is constant in the thickness direction.

The through-hole inner surface insulating portions 22 are formed on the through-hole inner surfaces 171 of the through-holes 17. The through-hole inner surface insulating portions 22 are formed through CVD (Chemical Vapor Deposition), for example. The through-hole inner surface insulating portions 22 are formed of $SiO_2$ or SiN, for example.

Figure 16:
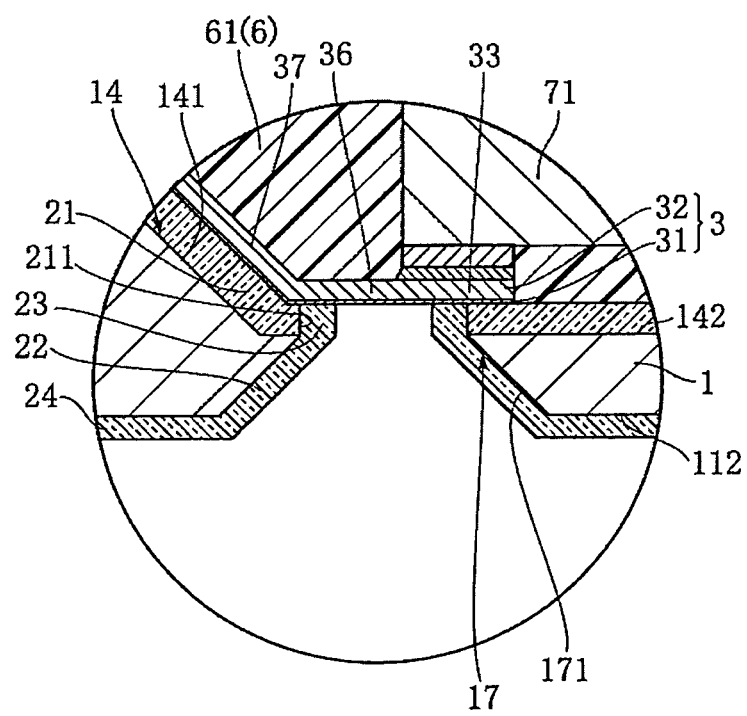
FIG. 16 is an enlarged cross-sectional view showing a relevant part of an example of the method for manufacturing the electronic device shown in FIG. 1.
Figure 17:
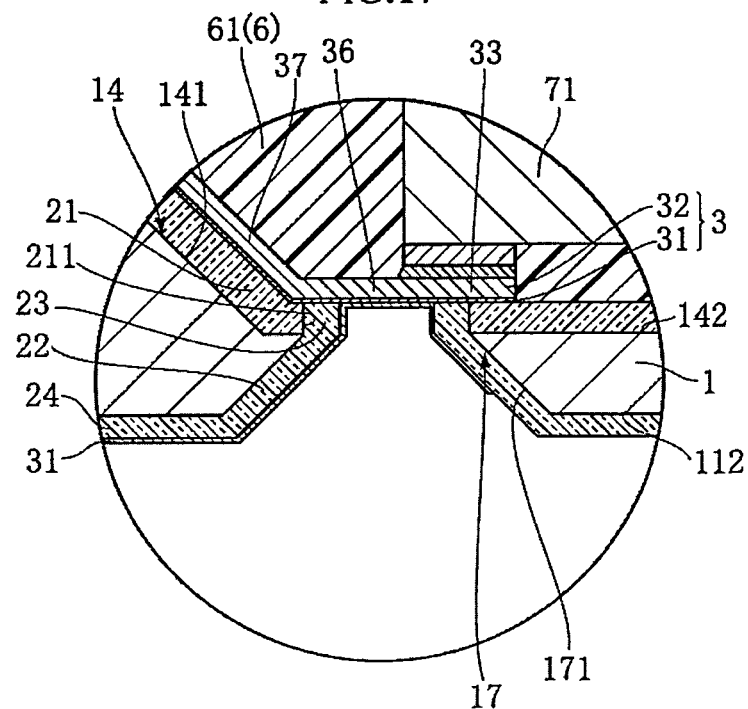
FIG. 17 is an enlarged cross-sectional view showing a relevant part of an example of the method for manufacturing the electronic device shown in FIG. 1.

As shown in FIGS. 16 and 17, which will be described later, the auxiliary through-hole inner surface insulating portions 23 are formed on the inner surfaces of the auxiliary through-holes 211 of the recessed portion inner surface insulating portions 21. The auxiliary through-hole inner surface insulating portions 23 are formed through CVD (Chemical Vapor Deposition), for example. The auxiliary through-hole inner surface insulating portions 23 are formed of $SiO_2$ or SiN, for example.

At least a portion of the back surface side insulating portion 24 is formed on the back surface 112 of the substrate 1. The back surface side insulating portion 24 is formed through thermal oxidation. The back surface side insulating portion 24 is formed of $SiO_2$, for example.

The conducting layer 3 is electrically connected to the main electronic element 71 and the auxiliary electronic elements 8. The conducting layer 3 is for constituting a current path for performing input to and output from the main electronic element 71 and the auxiliary electronic elements 8. The conducting layer 3 is formed on the element arrangement recessed portion side surfaces 141, the element arrangement recessed portion bottom surface 142, the through-hole inner surfaces 171, and the back surface 112. More specifically, the conducting layer 3 is formed so as to span from the element arrangement recessed portion 14 to the back surface 112 via the through-hole inner surfaces 171.

The conducting layer 3 includes a seed layer 31 and a plating layer 32.

The seed layer 31 is a so-called base layer for forming the desired plating layer 32. The seed layer 31 is interposed between the substrate 1 and the plating layer 32. The seed layer 31 is formed of Cu, for example. The seed layer 31 is formed through sputtering, for example. The thickness of the seed layer 31 is 1 μm or less, for example.

The plating layer 32 is formed through electrolytic plating using the seed layer 31. The plating layer 32 is formed of Cu or a layer in which Ti, Ni, Cu, and the like are stacked, for example. The thickness of the plating layer 32 is about 3 to 10 μm, for example. The thickness of the plating layer 32 is thicker than the thickness of the seed layer 31.

The conducting layer 3 includes element arrangement recessed portion pads 33, through-hole inner surface conducting portions 35, auxiliary through-hole blocking portions 36, and a connection path 37.

The element arrangement recessed portion pads 33 are formed in the element arrangement recessed portion 14, and in particular, are formed on the element arrangement recessed portion bottom surface 142. The element arrangement recessed portion pads 33 formed on the element arrangement recessed portion bottom surface 142 are used for mounting the main electronic element 71 on the element arrangement recessed portion bottom surface 142.

The through-hole inner surface conducting portions 35 include portions formed on the through-hole inner surfaces 171 of the through-holes 17. In the present embodiment, as shown in FIG. 1 and FIGS. 16 and 17, which will be described later, the through-hole inner surface conducting portions 35 include, in the through-hole inner surfaces 171 of the through-holes 17, portions stacked on the through-hole inner surface insulating portions 22 of the insulating layer 2, and portions formed on the auxiliary through-hole inner surface insulating portions 23. Furthermore, the through-hole inner surface conducting portions 35 include portions that are arranged so as to form the bottom surfaces of the through-holes 17 and are at a right angle to the thickness direction.

As shown in FIGS. 16 and 17, which will be described later, the auxiliary through-hole blocking portions 36 block the through-holes 17 from the main surface 111 side and form the same layer as the element arrangement recessed portion pads 33 formed on the element arrangement recessed portion bottom surface 142. The auxiliary through-hole blocking portions 36 and the through-hole inner surface conducting portions 35 are in contact with each other.

The connection path 37 forms a path through which the main electronic element 71 and the multiple auxiliary electronic elements 8 mainly are electrically connected. As shown in FIGS. 1 and 3, in the present embodiment, the connection path 37 is formed on the element arrangement recessed portion side surface 141, the element arrangement recessed portion bottom surface 142, and the main surface 111. A portion of the connection path 37 that is formed on the element arrangement recessed portion side surface 141 is connected in series to the multiple auxiliary electronic elements 8. A portion of the connection path 37 that is formed on the main surface 111 can connect the multiple auxiliary electronic elements 8 in series to each other. Also, if part of the connection path 37 is removed with a later-described method, the connection state of the multiple auxiliary electronic elements 8 is changed.

At least a portion of the back surface side insulating film 41 is formed on the back surface 112. The back surface side insulating film 41 has portions formed in the through-holes 17. The conducting layer 3 is interposed between the back surface side insulating film 41 and the substrate 1. The back surface side insulating film 41 is formed of SiN, for example. The back surface side insulating film 41 is formed through CVD, for example.

The back surface electrode pads 51 are formed on the back surface 112. The back surface electrode pads 51 are in contact with the conducting layer 3 and are electrically connected to the main electronic element 71 and the auxiliary electronic elements 8. The back surface electrode pads 51 each have a structure in which a Ni layer, a Pd layer, and a Au layer, in order of closeness to the substrate 1, for example, are stacked. In the present embodiment, the back surface electrode pads 51 are rectangular.

The sealing resin portion 6 fills the element arrangement recessed portion 14 and covers the main electronic element 71 and the multiple auxiliary electronic elements 8. Examples of the material of the sealing resin portion 6 include epoxy resin, phenol resin, polyimide resin, polybenzoxazole (PBO) resin, and silicone resin. The sealing resin portion 6 may be either translucent resin or non-translucent resin, but in the present embodiment, non-translucent resin is preferable. In the present embodiment, a through-hole 63 is formed in the sealing resin portion 6. The through-hole 63 overlaps with the main surface 111 in a view in the thickness direction and causes part of the portion of the connection path 37 formed on the main surface 111 to be exposed from the sealing resin portion 6.

The main electronic element 71 is mounted on the element arrangement recessed portion bottom surface 142. For example, examples of the main electronic element 71 include integrated circuit elements, or more specifically, so-called ASIC (Application Specific Integrated Circuit) elements. Alternatively, other examples of the main electronic element 71 include passive elements such as inductors and capacitors.

The multiple auxiliary electronic elements 8 are formed on the element arrangement recessed portion side surface 141. In the present invention, the auxiliary electronic elements 8 being formed on the element arrangement recessed portion side surface 141 indicates a mode that is different from a mode in which certain electronic elements are mounted on the element arrangement recessed portion side surface 141 with a bonding method such as solder, for example. That is to say, it indicates a mode in which the main elements constituting the auxiliary electronic-elements 8 are stacked directly or indirectly on the element arrangement recessed portion side surface 141, a mode in which the main elements constituting the auxiliary electronic elements 8 are included due to part of the element arrangement recessed portion side surface 141 being modified, or the like.

In the present embodiment, the multiple auxiliary electronic elements 8 are resistors. The auxiliary electronic elements 8 each have a resistive layer 81. As shown in FIG. 2, the resistive layer 81 is formed on the recessed portion inner surface insulating portion 21 covering the element arrangement recessed portion side surface 141. The resistive layer 81 is formed of a material by which a required resistance can be realized in the resistor, examples of which include silicon-chromium alloy, nickel-chromium alloy, and the like. The thickness of the resistive layer 81 is about 5 to 50 nm, for example.

In the present embodiment, both end portions of the resistive layer 81 are covered by the connection path 37. Accordingly, the resistive layer 81 is electrically connected to the connection path 37.

As shown in FIG. 3, in the present embodiment, the multiple auxiliary electronic elements 8 are formed on the element arrangement recessed portion side surface 141. In the example shown in the drawing, four auxiliary electronic elements 8 are arranged. In the state shown in the drawing, only the two auxiliary electronic elements 8 located at the upper and lower ends in the drawing are incorporated in the current path, and the two auxiliary electronic elements 8 located in the middle are not incorporated in the current path due to the fact that the connection path 37 constitutes a bypass path on the main surface 111. On the other hand, as another configuration, it is possible to realize a configuration in which the central portion of the portion of the connection path 37 located on the main surface 111 is removed with a method such as a laser, using the above-described through-hole 63 in the sealing resin portion 6. In this configuration, the four auxiliary electronic elements 8 are directly connected via the remaining connection path 37. Note that after removing part of the connection path 37 with a means such as a laser, the through-hole 63 may be filled with resin or the like.

Next, an example of a method for manufacturing the electronic device A1 will be described below with reference to FIGS. 4 to 19.

First, the substrate 1 is prepared as shown in FIG. 4. The substrate 1 is formed of a single-crystal semiconductor material, and in the present embodiment, it is formed of single-crystal Si. The thickness of the substrate 1 is 200 to 550 μm, for example. The substrate 1 is of a size such that it is possible to obtain multiple substrates 1 for the above-described electronic device A1. That is to say, the following manufacturing steps are based on a method for manufacturing multiple electronic devices A1 at once. It is possible to use a method for manufacturing one electronic device A1, but considering industrial efficiency, it is practical to use a method for manufacturing multiple electronic devices A1 at once. Strictly speaking, the substrate 1 shown in FIG. 4 is different from the substrate 1 in the electronic device A1, but in order to facilitate understanding, all substrates are indicated as "substrate 1".

The substrate 1 has the main surface 111 and the back surface 112, which face mutually opposite sides. In the present embodiment, a surface whose crystal orientation is (100), that is, a (100) surface, is used as the main surface 111.

Next, a mask layer formed of $SiO_2$ is formed through, for example, oxidation of the main surface 111. The thickness of the mask layer is around 0.7 to 1.0 μm, for example.

Next, patterning by means of, for example, etching is performed on the mask layer. Accordingly, a rectangular opening, for example, is formed in the mask layer. The shape and size of the opening is set according to the shape and size of the element arrangement recessed portion 14 that is to ultimately be obtained.

Next, anisotropic etching using KOH, for example, is performed on the substrate 1. KOH is an example of an alkali etching solution by which favorable anisotropic etching can be realized for single-crystal Si. Accordingly, a recessed portion is formed in the substrate 1. The recessed portion has a bottom surface and side surfaces. The bottom surface is at a right angle to the thickness direction. The angle that the side surfaces form with respect to a plane that is orthogonal to the thickness direction is about 55°.

Next, the mask layer is removed. By performing the etching, the element arrangement recessed portion 14 shown in FIG. 5 is formed. The element arrangement recessed portion 14 has the element arrangement recessed portion side surfaces 141 and the element arrangement recessed portion bottom surface 142, and is recessed from the main surface 111. The element arrangement recessed portion 14 is rectangular in a view in the thickness direction.

Figure 6:
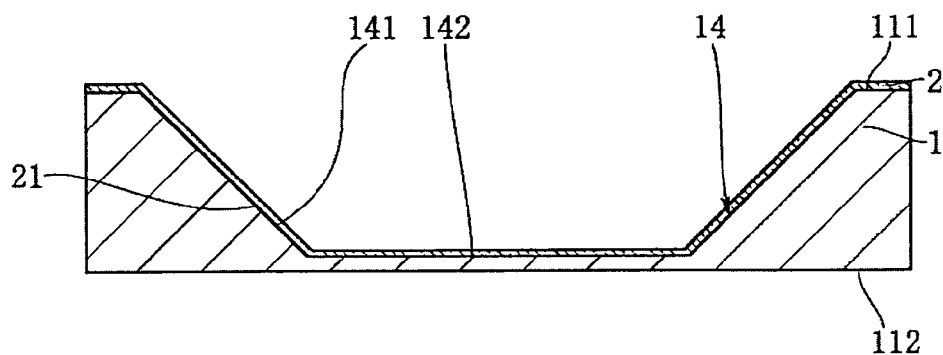
FIG. 6 is a cross-sectional view showing an example of a method for manufacturing the electronic device shown in FIG. 1.
Figure 7:
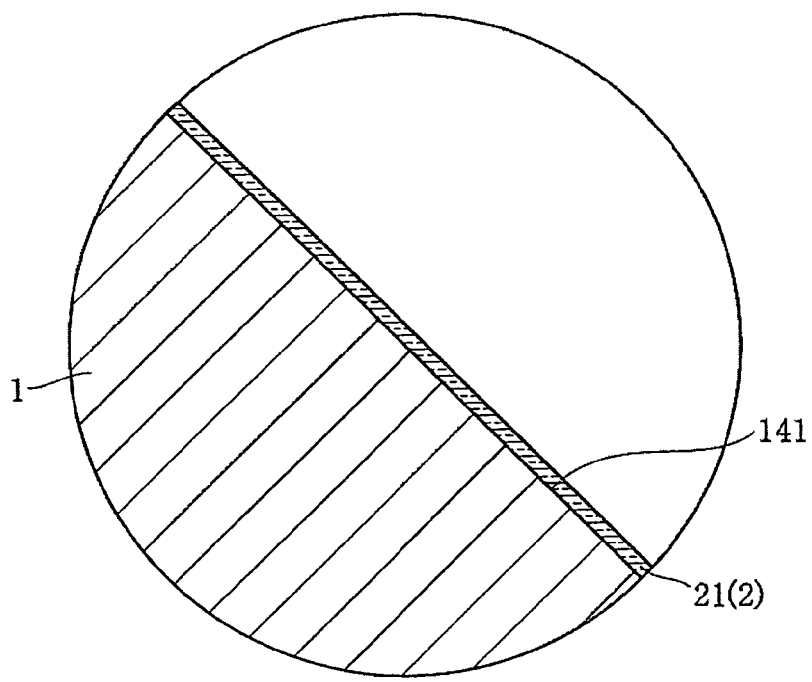
FIG. 7 is an enlarged cross-sectional view showing a relevant part of an example of a method for manufacturing the electronic device shown in FIG. 1.

Next, as shown in FIGS. 6 and 7, the insulating layer 2 is formed on the main surface 111, the element arrangement recessed portion side surfaces 141 and the element arrangement recessed portion bottom surface 142 through thermal oxidation. The portion of the insulating layer 2 that covers the element arrangement recessed portion side surfaces 141 and the element arrangement recessed portion bottom surface 142 is to be the above-described recessed portion inner surface insulating portion 21.

Figure 8:
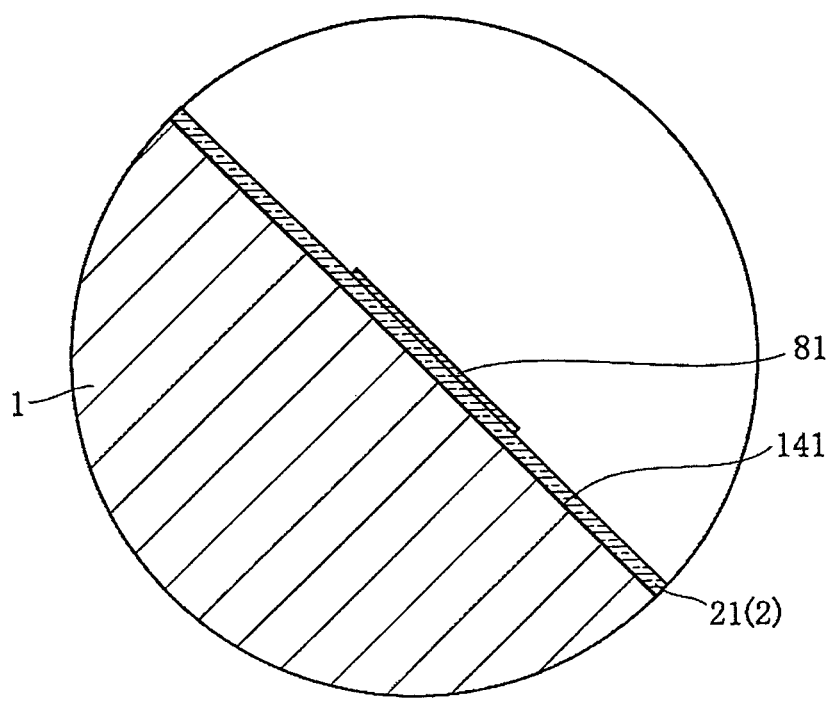
FIG. 8 is an enlarged cross-sectional view showing a relevant part of an example of a method for manufacturing the electronic device shown in FIG. 1.

Next, the resistive layers 81 are formed as shown in FIG. 8. In the forming of the resistive layers 81, a thin film of silicon-chromium alloy, nickel-chromium alloy, or the like is formed on the entire surface of the insulating layer 2 with a thin film forming method such as sputtering, for example. Then, by carrying out patterning such as etching on the thin film, in the present embodiment, the four resistive layers 81 are formed on the portion of the recessed portion inner surface insulating portion 21 that covers the element arrangement recessed portion side surface 141.

Figure 9:
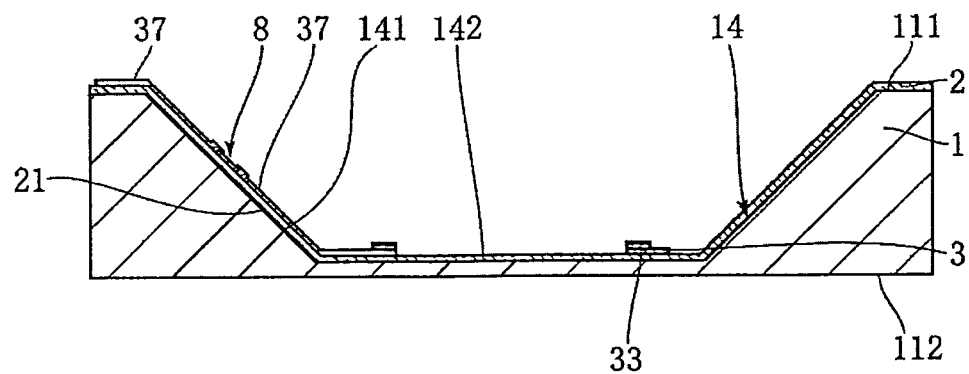
FIG. 9 is a cross-sectional view showing an example of a method for manufacturing the electronic device shown in FIG. 1.
Figure 10:
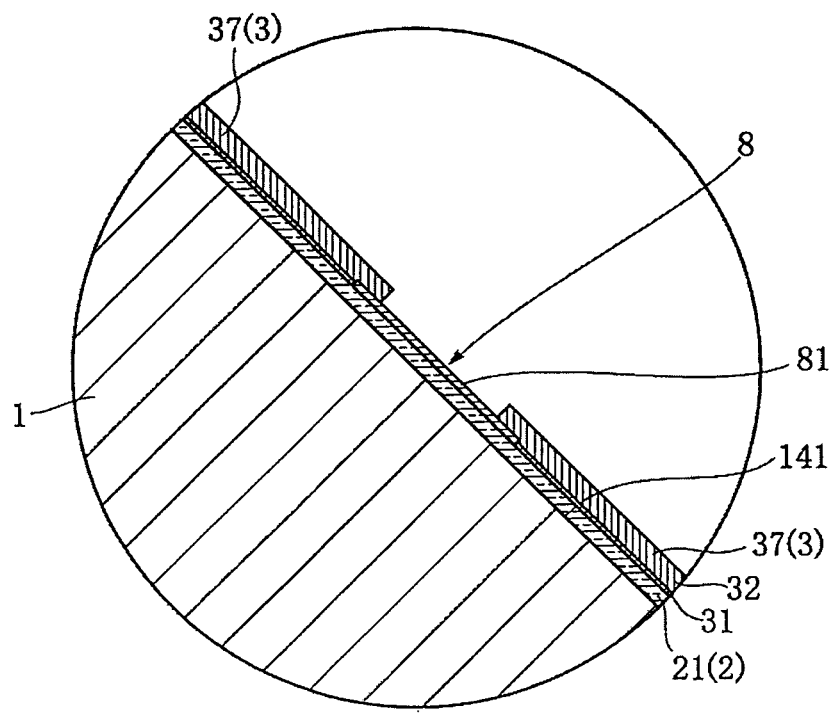
FIG. 10 is an enlarged cross-sectional view showing a relevant part of an example of the method for manufacturing the electronic device shown in FIG. 1.

Next, as shown in FIGS. 9 and 10, the seed layer 31 and the plating layer 32 are formed. The seed layer 31 is formed by performing sputtering using Cu, for example, and then carrying out patterning. The plating layer 32 is formed through electrolytic plating using the seed layer 31, for example. As a result, the plating layer 32, which is formed of Cu or a layer in which Ti, Ni, Cu, and the like are stacked, for example, is obtained. The seed layer 31 and the plating layer 32 form the conducting layer 3 by being stacked. At this time, the conducting layer 3 has a shape in which the element arrangement recessed portion pads 33 and the connection path 37 are included, for example. Also, as shown in FIG. 10, the connection path 37 has a shape that covers both end portions of the resistive layers 81. Accordingly, the multiple auxiliary electronic elements 8 are formed. Note that in the etching carried out in the formation of the seed layer 31 and the plating layer 32, it is desirable that only the material of the seed layer 31 and the plating layer 32 is selectively dissolved and the resistive layer 81 is selectively allowed to remain.

Figure 11:
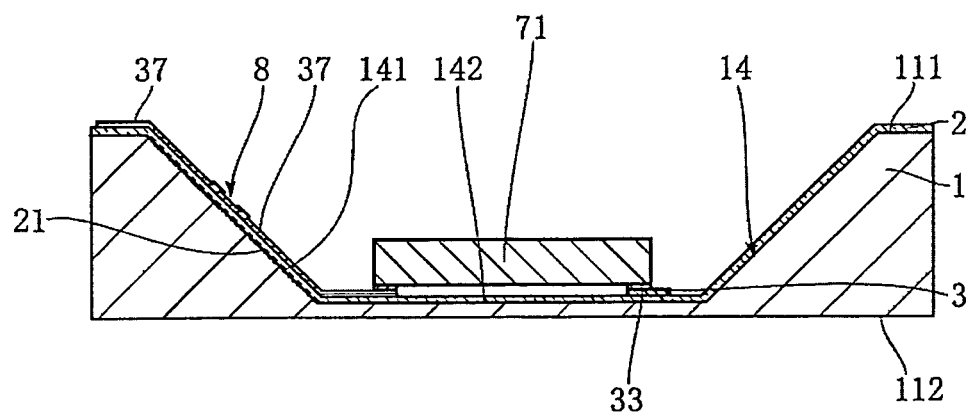
FIG. 11 is a cross-sectional view showing an example of the method for manufacturing the electronic device shown in FIG. 1.

Next, the main electronic element 71 is arranged in the element arrangement recessed portion 14 as shown in FIG. 11. More specifically, the main electronic element 71 is mounted on the element arrangement recessed portion bottom surface 142. Solder balls, for example, are formed on the main electronic element 71. The solder balls are coated with flax. The main electronic element 71 is mounted using the adhesiveness of the flax. Also, the arrangement of the main electronic element 71 is completed by melting the solder balls with a reflow oven and then allowing them to solidify. Instead of the method of forming solder balls, it is possible to use a method of coating the element arrangement recessed portion pads 33 of the conducting layer 3 with a solder paste.

Figure 12:
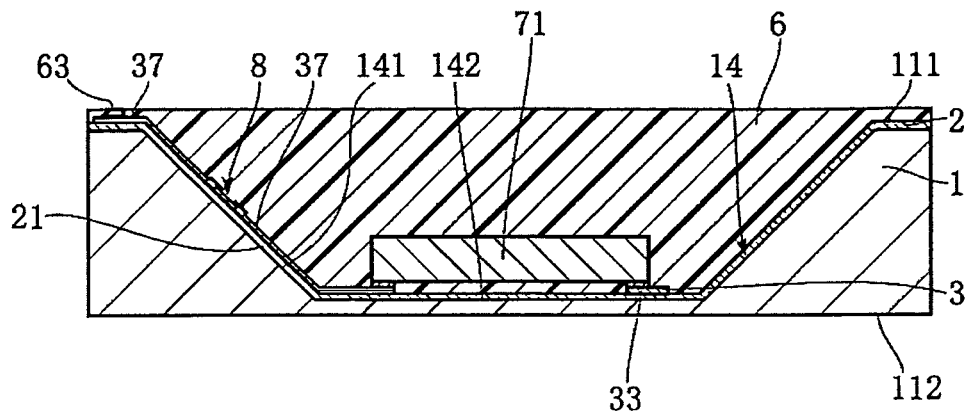
FIG. 12 is a cross-sectional view showing an example of the method for manufacturing the electronic device shown in FIG. 1.

Next, the sealing resin portion 6 is formed as shown in FIG. 12. The sealing resin portion 6 is formed, for example, by filling a space surrounded by the element arrangement recessed portion bottom surface 142 and the element arrangement recessed portion side surfaces 141 with a resin material that has excellent permeability and is cured through light exposure, such that the main electronic element 71 is covered, and curing the resin material. Next, in the present embodiment, the sealing resin portion 6 is formed so as to cover the main surface 111. Also, the through-hole 63 is formed by removing a portion of the sealing resin portion 6.

Figure 13:
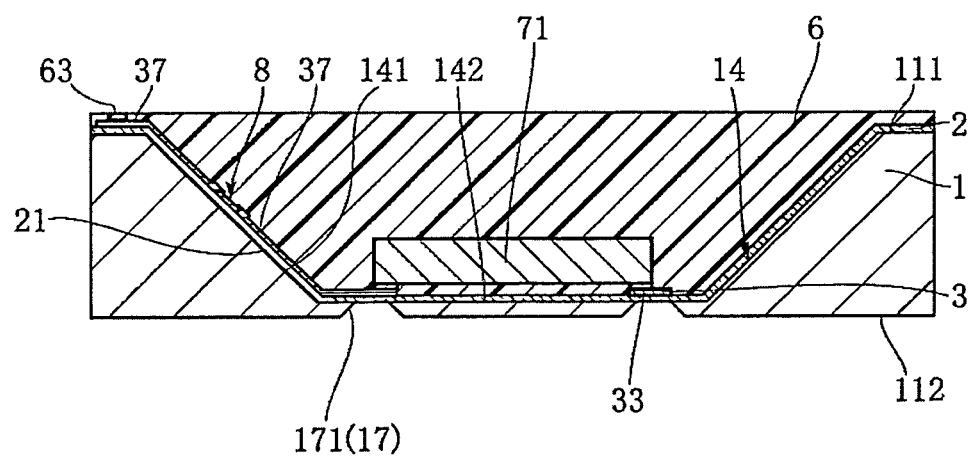
FIG. 13 is a cross-sectional view showing an example of the method for manufacturing the electronic device shown in FIG. 1.

Next, the through-holes 17 are formed as shown in FIG. 13. In the forming of the through-holes 17, a mask layer formed of $SiO_2$ is formed through thermal oxidation of the back surface 112, for example. Next, openings are provided in the mask layer at positions corresponding to the through-holes 17. Then, anisotropic etching using KOH, for example, is performed. Accordingly, the through-holes 17 having the through-hole inner surfaces 171, which are inclined with respect to the thickness direction, are obtained.

Figure 14:
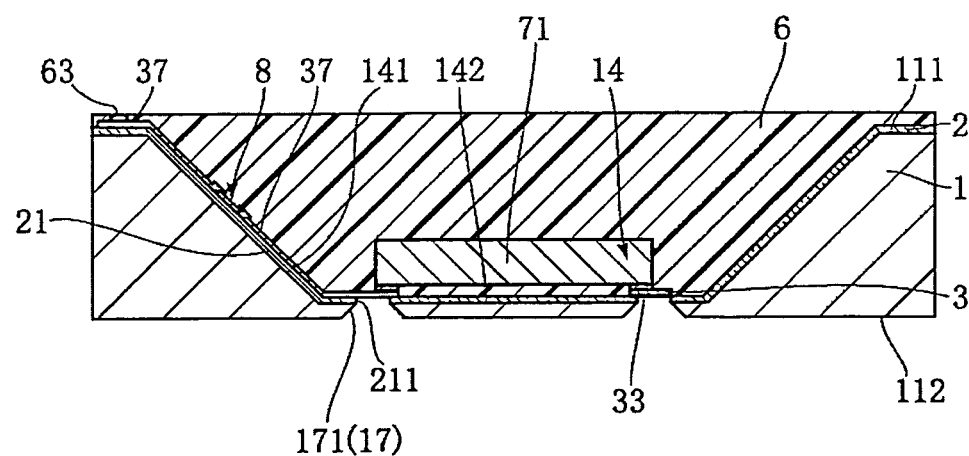
FIG. 14 is a cross-sectional view showing an example of the method for manufacturing the electronic device shown in FIG. 1.

Next, the auxiliary through-holes 211 are formed as shown in FIG. 14. Specifically, dry etching, for example, is carried out on the portions of the recessed portion inner surface insulating portion 21 of the insulating layer 2 that are exposed from the main electronic element 71 on the back surface 112 side. Accordingly, the auxiliary through-holes 211 with cross-sectional shapes that are constant in the thickness direction are formed at those portions of the recessed portion inner surface insulating portion 21.

Figure 15:
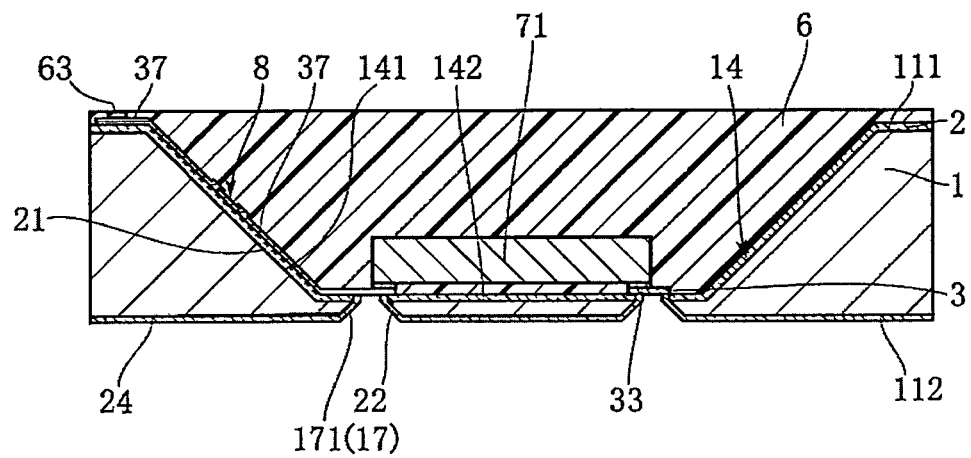
FIG. 15 is a cross-sectional view showing an example of the method for manufacturing the electronic device shown in FIG. 1.

Next, the through-hole inner surface insulating portions 22, the auxiliary through-hole inner surface insulating portions 23, and the back surface side insulating portion 24 are formed as shown in FIGS. 15 and 16. These elements are formed by performing CVD using an insulating material such as $SiO_2$ or SiN, for example, and then carrying out patterning.

Next, as shown in FIG. 17, the seed layer 31 is formed at suitable locations on the through-hole inner surface insulating portions 22, the auxiliary through-hole inner surface insulating portions 23, and the back surface side insulating portion 24 of the insulating layer 2. The seed layer 31 is formed by performing sputtering using Cu and then carrying out patterning, for example.

Figure 18:
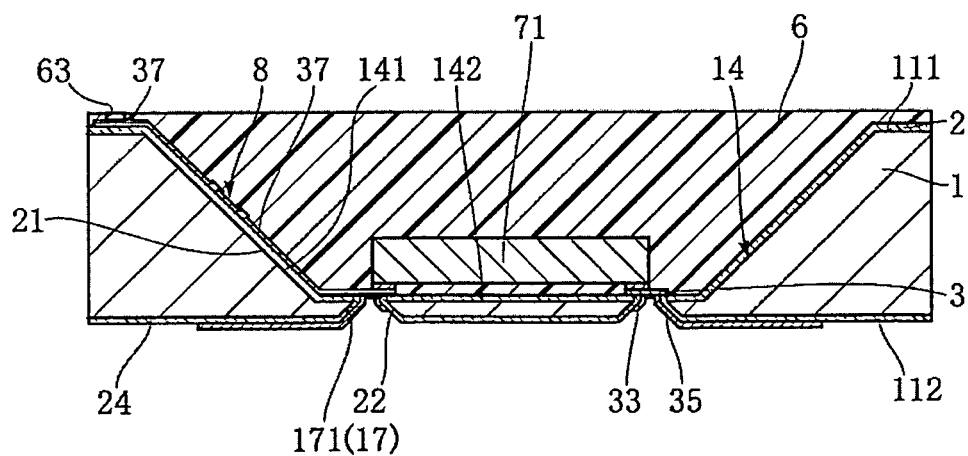
FIG. 18 is a cross-sectional view showing an example of the method for manufacturing the electronic device shown in FIG. 1.

Next, as shown in FIG. 18, the plating layer 32 is formed at suitable locations on the through-hole inner surface insulating portions 22, the auxiliary through-hole inner surface insulating portions 23, and the back surface side insulating portion 24 of the insulating layer 2. The plating layer 32 is formed through electrolytic plating using the seed layer 31, for example. As a result, the plating layer 32, which is formed of Cu or a layer in which Ti, Ni, Cu, and the like are stacked, for example, is obtained. Then, the through-hole inner surface conducting portions 35 of the conducting layer 3 are formed.

Figure 19:
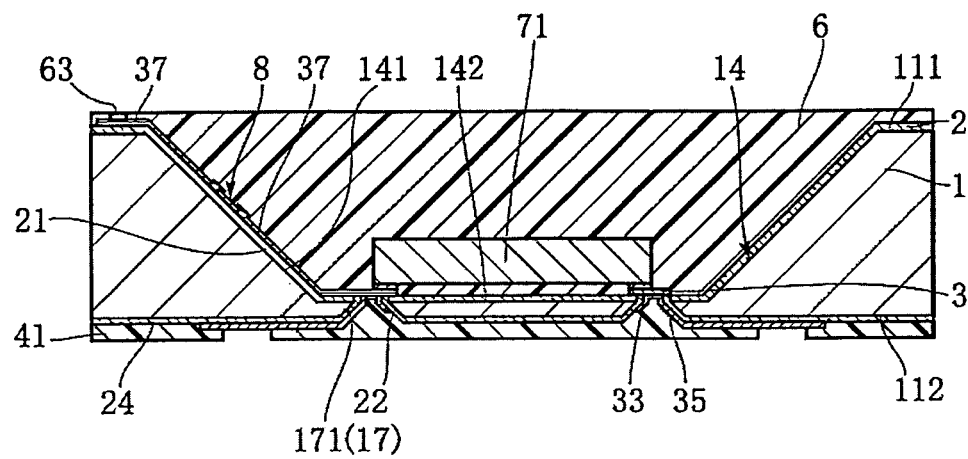
FIG. 19 is a cross-sectional view showing an example of the method for manufacturing the electronic device shown in FIG. 1.

Next, the back surface side insulating film 41 is formed as shown in FIG. 19. The back surface side insulating film 41 is formed by performing CVD using SiN, for example, and then carrying out patterning. Thereafter, the back surface electrode pads 51 are formed. The back surface electrode pads 51 are formed through non-electrolytic plating with a metal such as Ni, Pd, or Au, for example.

Then, the substrate 1 is cut with a dicer, for example, whereby the electronic device A1 shown in FIGS. 1 and 2 is obtained.

Next, effects of the electronic device A1 will be described.

According to the present embodiment, the auxiliary electronic elements 8 are formed on the element arrangement recessed portion side surface 141. Unlike the mode of being mounted using solder or the like, for example, the main elements of the auxiliary electronic elements 8 are formed directly or indirectly on the element arrangement recessed portion side surface 141. As a result, compared with the case of mounting individually-formed auxiliary electronic elements 8 on the element arrangement recessed portion side surface 141, the arrangement accuracy of the auxiliary electronic elements 8 can be significantly increased, which contributes to a smaller size and high-density arrangement of the auxiliary electronic elements 8. Accordingly, it is possible to achieve a smaller size of the electronic device A1.

By forming the resistive layer 81 on the recessed portion inner surface insulating portion 21 on which a relatively smooth surface can be formed, it is possible to form a resistive layer 81 that is finer and thinner. This makes it suitable for setting the resistance of the auxiliary electronic elements 8 serving as resistors to a desired value.

It is possible to select how the multiple auxiliary electronic elements 8 are to be incorporated in the electrical connection path according to whether or not the connection path 37 is selectively removed. Accordingly, the resistance of the entire group of resistive elements constituting the multiple auxiliary electronic elements 8 can be adjusted easily and reliably.

The through-holes 17 that penetrate from the element arrangement recessed portion 14 to the back surface 112 are formed in the substrate 1. The conducting layer 3 is formed so as to extend from the element arrangement recessed portion 14 to the back surface 112 via the through-hole inner surfaces 171. According to this configuration, a current path from the element arrangement recessed portion side to the back surface 112 side can be formed. According to this, a configuration is realized in which an electrical connection path that is needed for causing the main electronic element 71 to operate overlaps with the main electronic element 71 in a view in the thickness direction, for example. Accordingly, this is suitable for achieving a smaller size of the electronic device A1 in a view in the thickness direction.

In the present embodiment, the element arrangement recessed portion side surfaces 141 are inclined with respect to the thickness direction Z. According to this configuration, the element arrangement recessed portion side surfaces 141 can be formed so as to be relatively flat. For this reason, the advantage that the seed layer 31 (i.e., the conducting layer 3) is easier to form can be obtained.

In the present embodiment, the through-hole inner surfaces 171 are inclined with respect to a thickness direction Z. According to this configuration, the through-hole inner surfaces 171 can be formed so as to be relatively flat. For this reason, the advantage that the seed layer 31 (i.e., the conducting layer 3) is easier to form can be obtained.

The auxiliary through-hole blocking portions 36 and the through-hole inner surface conducting portions 35 are in contact at the boundary portions between the element arrangement recessed portion 14 (element arrangement recessed portion bottom surface 142) and the through-holes 17. This contact is achieved in a surface area corresponding to the surface area of the bottom portions of the through-holes 17. Accordingly, it is possible to more reliably electrically connect the auxiliary through-hole blocking portions 36 and the through-hole inner surface conducting portions 35, or in other words, the portions of the conducting layer 3 that are formed on the back surface 112 side and the portions of the conducting layer 3 that are formed on the element arrangement recessed portion 14 side.

Figure 20:
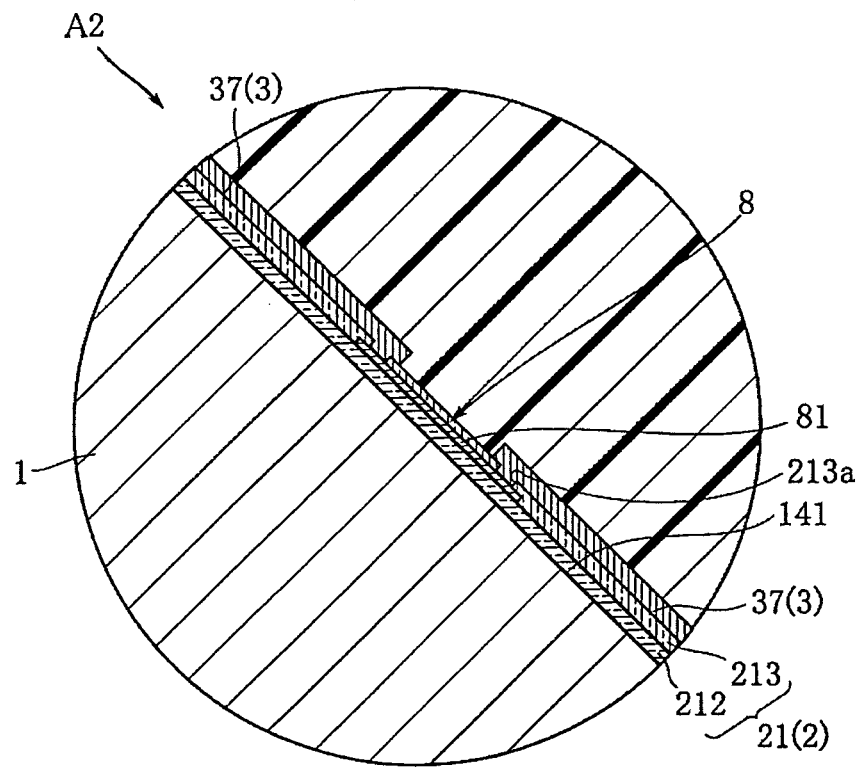
FIG. 20 is an enlarged cross-sectional view showing a relevant part of an electronic device based on a third embodiment of the present invention.

FIGS. 20 to 22 show other embodiments of the present invention. Note that in these drawings, elements that are the same as or similar to those in the above-described embodiment are denoted by the same reference numerals as in the above-described embodiment.

FIG. 20 shows an electronic device based on a second embodiment of the present invention. An electronic device A2 of the present embodiment differs from that of the above-described embodiment mainly in the configuration of the auxiliary electronic elements 8.

In the electronic device A2, the recessed portion inner surface insulating portion 21 of the insulating layer 2 is formed of a first insulating layer 212 and a second insulating layer 213. This kind of configuration may be used in the entirety of the insulating layer 2, or in the entirety of the recessed portion inner surface insulating portion 21, or it may be applied to only the site shown in FIG. 19.

The first insulating layer 212 and the second insulating layer 213 are formed of the same material as the above-described recessed portion inner surface insulating portion 21.

The resistive layer 81 is formed on the first insulating layer 212. The second insulating layer 213 covers most of the resistive layer 81. Multiple through-holes 213*a* are formed in the second insulating layer 213. The through-holes 213*a* penetrate the second insulating layer 213. Also, the through-holes 213*a* cause the portions near both ends of the resistive layer 81 to be exposed from the second insulating layer 213.

The connection path 37 is formed on the second insulating layer 213. The connection path 37 fills the through-holes 213*a* of the second insulating layer 213 and is electrically connected to the resistive layer 81 through the through-holes 213*a*.

According to this kind of embodiment as well, it is possible to achieve a smaller size of the electronic device A2. Also, in the case of forming the auxiliary electronic element 8 of the present embodiment, the resistive layer 81 is formed on the first insulating layer 212, whereafter the second insulating layer 213 is formed. Thereafter, a metal layer for forming the connection path 37 is formed by means of plating and is subjected to etching, and the like. In the etching, the resistive layer 81 is covered by the second insulating layer 213, and thus is not exposed to the etching liquid. Accordingly, the etching for forming the connection path 37 is advantageous in that it is not limited to being such that only the material of the connection path 37 is selectively dissolved and the resistive layer 81 is selectively allowed to remain.

FIG. 21 shows an electronic device based on a third embodiment of the present invention. An electronic device A3 of the present embodiment differs from that of the above-described embodiments mainly in the configuration of the auxiliary electronic elements 8.

With the electronic device A2, the resistive layer 81 is formed by modifying a portion of the element arrangement recessed portion side surface 141. More specifically, a dopant, which is an added impurity element, is implanted into the region of the element arrangement recessed portion side surface 141 in which the resistive layer 81 is to be formed. A dopant is used which modifies Si or the like, which is the material of the substrate 1, into a conductor having a desired resistance. Also, in order to electrically disconnect the main body of the substrate 1 and the resistive layer 81, doping for forming an electrical disconnection region, such as an insulating region or a pn junction region, may be performed in addition to doping for forming the resistive layer 81.

The resistive layer 81 is provided integrally in the element arrangement recessed portion side surface 141 and is covered by the recessed portion inner surface insulating portion 21. Through-holes 21*a* that cause suitable locations on the resistive layer 81 to be exposed from the recessed portion inner surface insulating portion 21 are formed on the recessed portion inner surface insulating portion 21. The connection path 37 is electrically connected to the resistive layer 81 through the through-holes 21*a*.

According to this kind of embodiment as well, it is possible to achieve a smaller size of the electronic device A3. Also, in the case of forming the resistive layer 81 by modifying the element arrangement recessed portion side surface 141, a step of performing fine etching on the conducting element layer or the like is not required. This is advantageous for increasing the efficiency of the manufacturing step, forming finer auxiliary electronic elements 8, and the like.

FIG. 22 shows an electronic device based on a fourth embodiment of the present invention. An electronic device A4 of the present embodiment differs from the above-described embodiments mainly in the configuration of the auxiliary electronic elements 8. In the present embodiment, the auxiliary electronic elements 8 are each configured as a capacitor.

Each auxiliary electronic element 8 has a first electrode layer 82, a second electrode layer 83, and a dielectric layer 84. Also, the recessed portion inner surface insulating portion 21 is configured to include the first insulating layer 212, the second insulating layer 213, and a third insulating layer 214.

The first insulating layer 212 is a layer formed on the element arrangement recessed portion side surface 141. The first electrode layer 82 is formed on the first insulating layer 212 and forms one of the electrodes of the auxiliary electronic element 8 serving as a capacitor. In a view in the normal direction of the element arrangement recessed portion side surface 141, the first electrode layer 82 is of a size at which it is possible to achieve a desired capacitance, and is rectangular, for example. The first electrode layer 82 is formed of a conductor such as Cu.

The dielectric layer 84 is interposed between the first electrode layer 82 and the second electrode layer 83, and thereby functions as a dielectric portion of the auxiliary electronic element 8 serving as a capacitor. In the present embodiment, the dielectric layer 84 is constituted by a portion of the second insulating layer 213. Also, a through-hole 213*a* that causes a portion of the first electrode layer 82 to be exposed from the second insulating layer 213 is formed in the second insulating layer 213. The second insulating layer 213 constituting the dielectric layer 84 is preferably formed of a ferroelectric material.

The second electrode layer 83 is formed on the second insulating layer 213 and forms the other of the electrodes of the auxiliary electronic element 8 serving as a capacitor. In a view in the normal direction of the element arrangement recessed portion side surface 141, the second electrode layer 83 is of a size at which it is possible to achieve a desired capacitance, and is rectangular, for example. The second electrode layer 83 is formed of a conductor such as Cu.

The third insulating layer 214 covers the second electrode layer 83. However, in the present embodiment, the third insulating layer 214 does not cover the through-hole 213*a* of the second insulating layer 213. A through-hole 214*a* is formed in the third insulating layer 214. The through-hole 214*a* causes a portion of the dielectric layer 84 to be exposed from the third insulating layer 214.

A portion of the connection path 37 is electrically connected to the first electrode layer 82 through the through-hole 213*a*. Also, another portion of the connection path 37 is electrically connected to the second electrode layer 83 through the through-hole 214*a*.

Note that the specific configuration in which the auxiliary electronic elements 8 are included as capacitors is not limited to the configuration of the electronic device A4. For example, instead of forming the first electrode layer 82 with a metal layer or the like, the first electrode layer 82 may be formed by modifying a portion of the element arrangement recessed portion side surface 141 as was described in the case of the electronic device A3.

According to the present embodiment as well, it is possible to achieve a smaller size of the electronic device A4. Also, there is no limitation on the function of the auxiliary electronic elements 8, and they may function as various kinds of electronic elements, such as resistors, capacitors, and the like. The auxiliary electronic elements 8 function as inductors, for example, by using a method similar to those of the electronic devices A1 to A4. Also, multiple auxiliary electronic elements that perform mutually different functions may be provided in one electronic device according to the present invention.

The electronic device according to the present invention is not limited to the above-described embodiments. The specific configuration of the units of the electronic device according to the present invention can be designed and modified in various ways.

The invention claimed is:

1. An electronic device comprising:
   a substrate having a main surface and a back surface that are mutually opposite in a thickness direction of the substrate, the substrate being made of a semiconductor material;
   a main electronic element;
   an auxiliary electronic element;
   a conducting layer electrically connected to the main electronic element; and
   an insulating layer,
   wherein the substrate is formed with an element arrangement recessed portion that is recessed from the main surface, the main electronic element being arranged in the element arrangement recessed portion,
   the element arrangement recessed portion has an element arrangement recessed portion bottom surface facing in the thickness direction and an element arrangement recessed portion side surface inclined with respect to the thickness direction,
   the auxiliary electronic element is provided on the element arrangement recessed portion side surface,
   the insulating layer includes a recessed portion inner surface insulating portion covering at least the element arrangement recessed portion side surface,
   the auxiliary electronic element is a resistor,
   the recessed portion inner surface insulating portion includes a first insulating layer disposed on the element arrangement recessed portion side surface, and a second insulating layer located away from the element arrangement recessed portion side surface, the resistor being provided between the first insulating layer and the second insulating layer, and
   the second insulating layer has an insulating layer through-hole through which the resistor and the conducting layer are connected.

2. The electronic device according to claim 1, wherein the resistor has a resistive layer formed on the recessed portion inner surface insulating portion.

3. The electronic device according to claim 1, wherein the substrate is formed with a substrate through-hole penetrating from the element arrangement recessed portion to the back surface, the substrate through-hole has a through-hole inner surface, and the conducting layer is formed so as to span from the element arrangement recessed portion to the back surface via the through-hole inner surface.

4. The electronic device according to claim 3, wherein the main electronic element is arranged on the element arrangement recessed portion bottom surface.

5. The electronic device according to claim 4, wherein the element arrangement recessed portion bottom surface is orthogonal to the thickness direction.

6. The electronic device according to claim 3, wherein the insulating layer is made of one of $SiO_2$ and SiN.

7. The electronic device according to claim 3, wherein the insulating layer includes a through-hole inner surface insulating portion formed on the through-hole inner surface of the substrate through-hole.

8. The electronic device according to claim 7, wherein a cross-sectional dimension of the substrate through-hole increases toward the back surface starting from the main surface.

9. The electronic device according to claim 8, wherein the recessed portion inner surface insulating portion has an auxiliary through-hole that coincides with an edge of the substrate through-hole located adjacent to the main surface as viewed in the thickness direction.

10. The electronic device according to claim 9, wherein the auxiliary through-hole has a constant cross-sectional shape in the thickness direction.

11. The electronic device according to claim 10, wherein the insulating layer includes an auxiliary through-hole inner surface insulating portion that is formed on an inner surface of the auxiliary through-hole and connects to the through-hole inner surface insulating portion.

12. The electronic device according to claim 3, wherein the insulating layer includes a back surface side insulating portion, and at least a portion of the back surface side insulating portion is formed on the back surface of the substrate.

13. The electronic device according to claim 12, further comprising a back surface insulating film at least a portion of which is formed on the back surface, wherein the back surface side insulating film has a portion formed in the substrate through-hole, and the conducting layer is disposed between the back surface side insulating film and the substrate.

14. The electronic device according to claim 13, further comprising a back surface electrode pad formed on the back surface, wherein the back surface electrode pad is in contact with the conducting layer and is electrically connected to the main electronic element.

15. The electronic device according to claim 1, further comprising a sealing resin portion that fills the element arrangement recessed portion and covers the main electronic element.

16. The electronic device according to claim 1, wherein the substrate is formed of a single-crystal semiconductor material.

17. The electronic device according to claim 16, wherein the semiconductor material is Si.

18. The electronic device according to claim 17, wherein the main surface and the back surface are each flat and orthogonal to the thickness direction of the substrate.

19. An electronic device, comprising:
   a substrate having a main surface and a back surface that are mutually opposite in a thickness direction of the substrate, the substrate being made of a semiconductor material;
   a main electronic element;
   an auxiliary electronic element;

a conducting layer electrically connected to the main electronic element; and an insulating layer, wherein the substrate is formed with an element arrangement recessed portion that is recessed from the main surface, the main electronic element being arranged in the element arrangement recessed portion, the element arrangement recessed portion has an element arrangement recessed portion bottom surface facing in the thickness direction and an element arrangement recessed portion side surface inclined with respect to the thickness direction, the auxiliary electronic element is provided on the element arrangement recessed portion side surface, the insulating layer includes a recessed portion inner surface insulating portion covering at least the element arrangement recessed portion side surface, the auxiliary electronic element is a resistor, and the resistor has a resistive layer formed by modifying a portion of the element arrangement recessed portion side surface.

20. The electronic device according to claim 19, wherein the recessed portion inner surface insulating portion covers the resistive layer.

21. The electronic device according to claim 20, wherein the recessed portion inner surface insulating portion has an insulating layer through-hole through which the resistive layer and the conducting layer are connected.

22. An electronic device, comprising:

a substrate having a main surface and a back surface that are mutually opposite in a thickness direction of the substrate, the substrate being made of a semiconductor material;

a main electronic element;

an auxiliary electronic element;

a conducting layer electrically connected to the main electronic element; and an insulating layer, wherein the substrate is formed with an element arrangement recessed portion that is recessed from the main surface, the main electronic element being arranged in the element arrangement recessed portion, the element arrangement recessed portion has an element arrangement recessed portion bottom surface facing in the thickness direction and an element arrangement recessed portion side surface inclined with respect to the thickness direction, the auxiliary electronic element is provided on the element arrangement recessed portion side surface, the substrate is formed with a substrate through-hole penetrating from the element arrangement recessed portion to the back surface, the substrate through-hole has a through-hole inner surface, and the conducting layer is formed so as to span from the element arrangement recessed portion to the back surface via the through-hole inner surface, the insulating layer includes: a recessed portion inner surface insulating portion covering at least the element arrangement recessed portion side surface; and a through-hole inner surface insulating portion formed on the through-hole inner surface of the substrate through-hole, the recessed portion inner surface insulating portion has an auxiliary through-hole that coincides with an edge of the substrate through-hole located adjacent to the main surface as viewed in the thickness direction, and the conducting layer includes an auxiliary through-hole blocking portion that blocks the auxiliary through-hole in the element arrangement recessed portion.

23. The electronic device according to claim 22, wherein the conducting layer includes a through-hole inner surface conducting portion that is in contact with the auxiliary through-hole blocking portion, at least a portion of the through-hole inner surface conducting portion being formed on the through-hole inner surface insulating portion.

24. An electronic device, comprising:

a substrate having a main surface and a back surface that are mutually opposite in a thickness direction of the substrate, the substrate being made of a semiconductor material;

a main electronic element;

an auxiliary electronic element; and a conducting layer electrically connected to the main electronic element, wherein the substrate is formed with an element arrangement recessed portion that is recessed from the main surface, the main electronic element being arranged in the element arrangement recessed portion, the element arrangement recessed portion has an element arrangement recessed portion bottom surface facing in the thickness direction and an element arrangement recessed portion side surface inclined with respect to the thickness direction, the auxiliary electronic element is provided on the element arrangement recessed portion side surface, and the conducting layer includes a seed layer and a plating layer, and the seed layer is disposed between the substrate and the plating layer.

25. An electronic device, comprising:

a substrate having a main surface and a back surface that are mutually opposite in a thickness direction of the substrate, the substrate being made of Si;

a main electronic element;

an auxiliary electronic element; and a conducting layer electrically connected to the main electronic element, wherein the substrate is formed with an element arrangement recessed portion that is recessed from the main surface, the main electronic element being arranged in the element arrangement recessed portion, the element arrangement recessed portion has an element arrangement recessed portion bottom surface facing in the thickness direction and an element arrangement recessed portion side surface inclined with respect to the thickness direction, the auxiliary electronic element is provided on the element arrangement recessed portion side surface, the main surface and the back surface are each flat and orthogonal to the thickness direction of the substrate, and the main surface is a (100) surface.

* * * * *